United States Patent
Lin et al.

[19]

[11] Patent Number: 6,037,259
[45] Date of Patent: Mar. 14, 2000

[54] METHOD FOR FORMING IDENTIFYING CHARACTERS ON A SILICON WAFER

[75] Inventors: Bih-Tiao Lin, Ping-Tung; Fu-Liang Yang, Tainan, both of Taiwan

[73] Assignee: Vanguard International Semiconductor Corporation, Hsin-Chu, Taiwan

[21] Appl. No.: 09/075,367

[22] Filed: May 11, 1998

[51] Int. Cl.[7] .................................................. H01L 21/302
[52] U.S. Cl. ........................ 438/692; 438/906; 438/959; 216/94; 347/224
[58] Field of Search .................................... 438/692, 906, 438/959; 216/94; 347/224

[56] References Cited

U.S. PATENT DOCUMENTS

| | | | |
|---|---|---|---|
| 5,175,425 | 12/1992 | Spratte et al. | 235/494 |
| 5,289,661 | 3/1994 | Jones et al. | 51/283 |
| 5,501,909 | 3/1996 | Higaki et al. | 428/408 |
| 5,628,870 | 5/1997 | Ye et al. | 438/729 |
| 5,643,053 | 7/1997 | Shendon | 451/28 |
| 5,688,360 | 11/1997 | Jarath | 156/345 |
| 5,825,789 | 10/1998 | Watanabe et al. | 372/71 |
| 5,877,064 | 3/1999 | Chang et al. | 438/401 |

*Primary Examiner*—Robert Kunemund
*Assistant Examiner*—Donald L. Champagne
*Attorney, Agent, or Firm*—George O. Saile; Stephen B. Ackerman; William S. Robertson

[57] ABSTRACT

After identifying characters are written on the wafer surface 16 as a pattern of small holes 19 formed with a laser in the wafer I.D. stage of a semiconductor manufacturing process, the wafer surface in the region of the I.D. is polished to break loose deposits of silicon 20 that are left on the wafer surface and the region is then washed. The process prevents semiconductor material deposited on the wafer surface during the laser operation from later breaking off as hard particles that can scratch the surface of the wafer.

11 Claims, 1 Drawing Sheet

METHOD FOR FORMING IDENTIFYING CHARACTERS ON A SILICON WAFER

FIELD OF THE INVENTION

This invention relates generally to the process for manufacturing a semiconductor wafer, and more specifically it relates to a method for forming characters on a surface of the wafer to identify the wafer during later steps of the process.

INTRODUCTION

In an early step of the familiar process for manufacturing semiconductor chips, a cylindrical ingot of the semiconductor material is formed. It will be convenient to suppose that the material is silicon, but the invention will be useful with any semiconductor material. The ingot is cut into wafers and the upper surface of a wafer is processed to form an array of chips.

A wafer formed from such an ingot is thin and circular except for a fiducial mark formed on the edge of the wafer as a reference for orienting the wafer. For example, the fiducial mark can be formed by cutting away the edge of the wafer between two points on the circumference to leave a flat edge that is geometrically a chord. This mark is formed on the ingot before the ingot is cut into wafers.

When a silicon ingot is first formed, it has a roughly cylindrical shape, and in a process called edge grinding the ingot is put into a lathe and ground to the cylindrical shape. After the edge grinding operation, a mark is made along the surface of the ingot, parallel to the axis of the ingot. When the wafers are cut from the ingot, each wafer has an identical fiducial mark where the mark was made along the surface of the ingot.

After a wafer has been cut from the ingot, it is also common to place a block of characters on the wafer that identify the particular wafer during the later manufacturing steps. The block of characters is called wafer I.D. Commonly, a character is formed by using a laser to burn a series of spaced apart holes in the surface of the wafer with and the operation is called the laser I.D. stage of the wafer manufacturing process. Commonly, these characters are placed along the chord that forms the fiducial mark.

SUMMARY OF THE INVENTION

We have found that the processing step of cutting the identifying holes with a laser leaves a silicon deposit along side the hole. This silicon deposit can break off during later processing stages, and the small pieces of silicon can scratch the surface of the wafer. These scratches are called micro scratches.

After the process step of forming the wafer I.D. we perform two steps to rid the wafer of the silicon particles. First, we use a polishing stone to break away the deposits and separate them from the wafer surface. Then we use a cleaning liquid to remove the separated silicon particles.

These operations are performed only on the small region of the wafer where the wafer I.D. has been formed. Then we continue the normal wafer processing. A typical next step is chemical and mechanical polishing step (CMP) which by itself does not rid the wafer surface of the deposits; in fact, breakage and scratching can easily occur at this stage without our polishing and cleaning steps.

Other objects and features of the invention will appear in the description of the preferred embodiment of the invention.

THE DRAWING

THE PREFERRED EMBODIMENT

Figure 1:
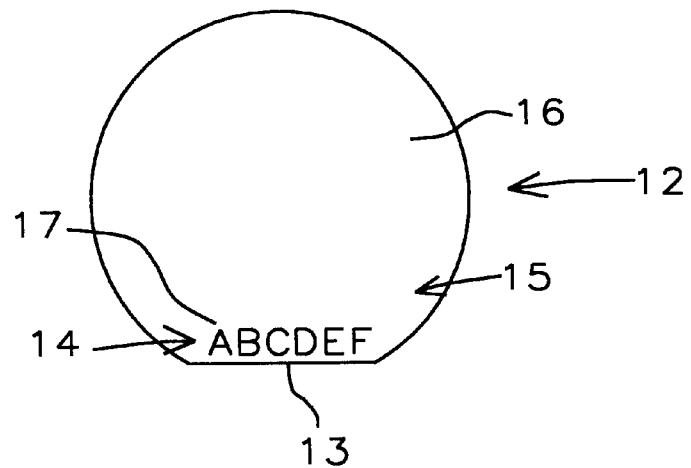
FIG. 1 is a top view of a wafer showing a wafer I.D.

Introduction—FIG. 1

In FIG. 1, a wafer 12 is circular except for a chord 13 formed conventionally in a previous processing step, as already described. A block 14 of characters is formed on a region 15 of wafer surface 16, preferably along chord 13. In FIG. 1, a representative character 17 is the letter "A" of the Latin alphabet and block 14 is human-readable.

Region 15 is small, on the order of the size of block 14, and the method steps that will be described later are limited to this region of the wafer.

These characters are formed by a series of spaced apart circular holes that are made with a laser. The preferred diameter of a hole is 90 µm (micro meters) and the preferred depth is 3 µm. These dimensions are given to present the environment of the invention, and the invention is useful with holes of various configurations and sizes in this general range. The use of a laser to form such holes is well known.

Similarly, a character 17 can be a slot and a block of slots can form a machine readable code. The terms "slot" and "circular hole" will be used to identify a particular form of the hole 19, but usually this description will apply to a hole of these general dimensions in any form. A slot has a width and depth that are similar to the hole diameter and depth respectively, and the section view as shown in FIG. 2 is the same for either a circular hole or a slot.

Figure 2:
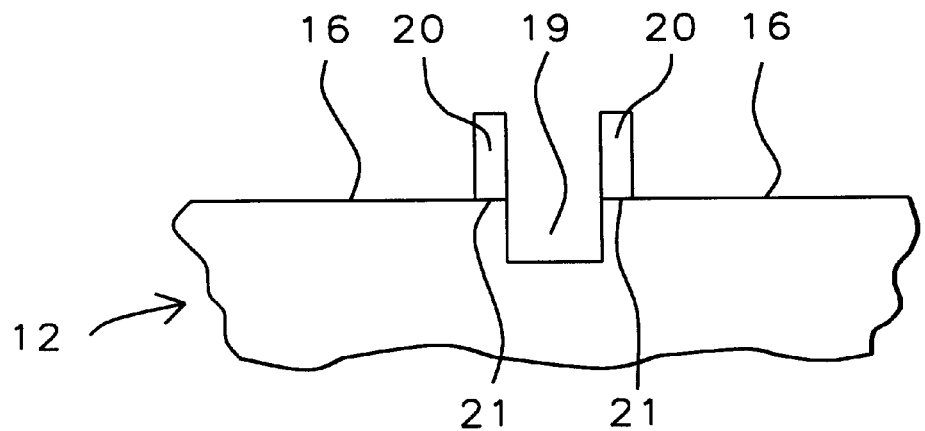
FIG. 2 is a section view of a semiconductor wafer showing material left on the wafer surface after the step of forming a hole for a wafer I.D.
Figure 3:
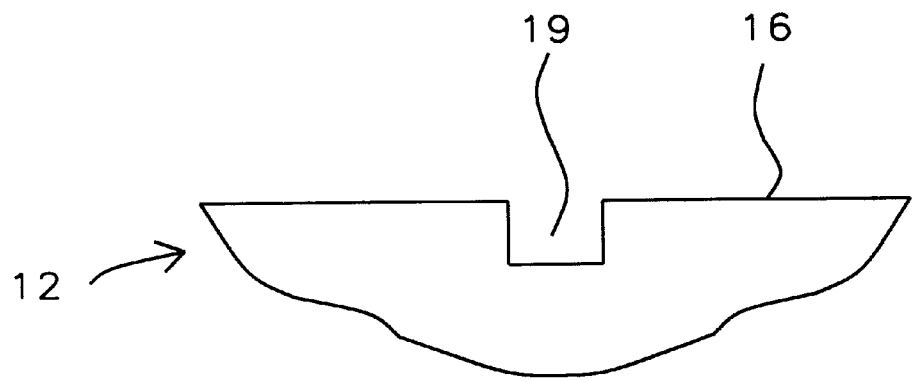
FIG. 3 is similar to FIG. 2 and shows the wafer after the steps to remove the excess semiconductor material.

The Silicon Deposits—FIG. 2

FIG. 2 shows a section of a hole 19 that forms part of one of the characters 17 in the top view of FIG. 1. The laser forms the hole by heating the silicon sufficiently for it to vaporize and diffuse away from the hole, and the silicon vapor then condenses and forms a deposit 20 around the edge of the hole. Line 21 in FIG. 1 represents the original surface of the wafer where the deposit forms.

In FIG. 2, the irregular shape of the deposit 20 is simplified to a rectangular cross section. For a circular hole, this shape corresponds to a ring of material around a hole 19. The volume of silicon in the deposit is of course equal to or less than the volume of silicon removed from the hole. The deposits tend to form with a sharp or narrow peak and uneven sides as seen in the section view of FIG. 2.

After the wafer I.D. stage of the process, the wafer undergoes a chemical and mechanical polishing step. During this stage, it is easy for the deposits to be broken away from the wafer. Line 21, where the deposit meets the original surface of the wafer, is a point of weakness and the break often occurs along line 21. The broken pieces of silicon are hard and sharp and easily form scratches (micro scratches) on the surface of the wafer.

The scratches can damage the circuit devices of the wafer in various ways, as is well known. For example, the scratches can cut across conductors and other structures of the device, and they can interfere with forming layers of the device above the scratch.

Removing the Deposits

We remove the deposits before the wafer is advanced to the next manufacturing stage.

In the preferred method for removing the deposits, the deposits are first broken away from the wafer. This step is performed with a polishing stone and it can be performed by hand. A polishing stone is otherwise unsuitable for use in semiconductor manufacture but will be familiar from the familiar task of sharpening a knife with such a stone.

Preferably, the polishing step is performed automatically with a machine. Suitable polishing machines are common in various manufacturing fields and will be understood by those skilled in the art.

The step of removing deposits 20 from the surface of the wafer leaves pieces of the silicon on the surface of wafer 12. To remove these silicon pieces, the region of the character block 14 is cleaned with a suitable liquid, preferably deionized water. The deionized water can be applied by hand with a small paint brush. Deionized water is commonly used for cleaning semiconductors, and this step of the method will be understood by those skilled in the art.

The conventional wafer process step is then continued with the next step, typically the CMP step as already described.

Summary

From this description of a preferred embodiment of the invention, those skilled in the art will recognize modifications within the spirit of the invention and the intended scope of the claims.

We claim:

1. A process for forming a block (14) of characters (17) constituting a wafer I.D. on a surface (16) of a semiconductor wafer (12), comprising the following steps, selecting a region (15) on the wafer surface to receive the characters, the size of the region being on the order of the size of the block, applying a laser beam to the region in the pattern of a selected character to heat the wafer and form a hole (19), wherein the heating step causes semiconductor material from the hole to form a deposit (20) along the edge of the hole, the deposit being subject to breakage into small particles of semiconductor that can cause scratches on the surface of the wafer, then polishing the wafer in the region to separate deposit particles from the wafer surface, then cleaning the region to remove the separated deposit particles, then performing the conventional step of chemical and mechanical polishing on the wafer.

2. The process of claim 1 wherein the wafer is circular except for a chord forming a fiducial mark and the wafer I.D. is formed near the chord.

3. The process of claim 1 wherein a hole is a circular hole and the holes are spaced apart to form a human-readable character.

4. The process of claim 1 wherein a hole is a slot and the slots are spaced apart to form a machine readable block of characters.

5. The process of claim 1 wherein the polishing step comprises polishing by hand using a polishing stone.

6. The process of claim 1 wherein the polishing step comprises polishing by machine.

7. The process of claim 6 wherein the polishing step comprises polishing by machine using a polishing stone.

8. The process of claim 7 wherein the cleaning step comprises cleaning the region with a liquid.

9. The process of claim 8 wherein the cleaning step comprises cleaning the region with deionized water.

10. The process of claim 9 wherein the hole is a circular hole having a diameter of about 90 $\mu$m and a depth of about 3 $\mu$m.

11. The process of claim 9 wherein a hole is a slot having a width of about 90 $\mu$m and a depth of about 3 $\mu$m.

* * * * *